United States Patent [19]
Tran et al.

[11] Patent Number: 6,111,783
[45] Date of Patent: Aug. 29, 2000

[54] MRAM DEVICE INCLUDING WRITE CIRCUIT FOR SUPPLYING WORD AND BIT LINE CURRENT HAVING UNEQUAL MAGNITUDES

[75] Inventors: Lung T. Tran, Saratoga; James A. Brug, Menlo Park, both of Calif.

[73] Assignee: Hewlett-Packard Company, Palo Alto, Calif.

[21] Appl. No.: 09/334,485

[22] Filed: Jun. 16, 1999

[51] Int. Cl.[7] .................................................. G11C 11/14
[52] U.S. Cl. ........................................... 365/171; 365/173
[58] Field of Search ............................... 365/55, 74, 171, 365/173, 48, 230.06, 131

[56] References Cited

U.S. PATENT DOCUMENTS

| | | | |
|---|---|---|---|
| 5,587,943 | 12/1996 | Torok et al. | 365/158 |
| 5,652,445 | 7/1997 | Johnson | 257/295 |

*Primary Examiner*—David Nelms
*Assistant Examiner*—Thong Le

[57] ABSTRACT

Data is written to a memory cell of a Magnetic Random Access Memory ("MRAM") device by supplying currents having substantially unequal magnitudes to word and bit lines crossing that memory cell. The substantially higher magnitude current may be supplied to the word lines.

14 Claims, 4 Drawing Sheets

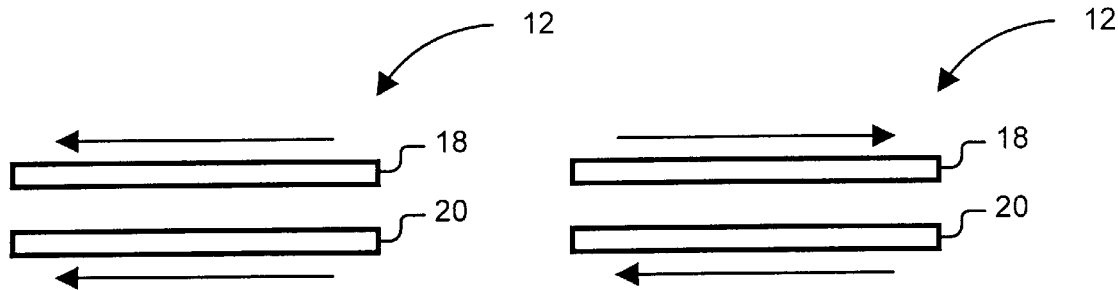
FIGURE 2a  FIGURE 2b
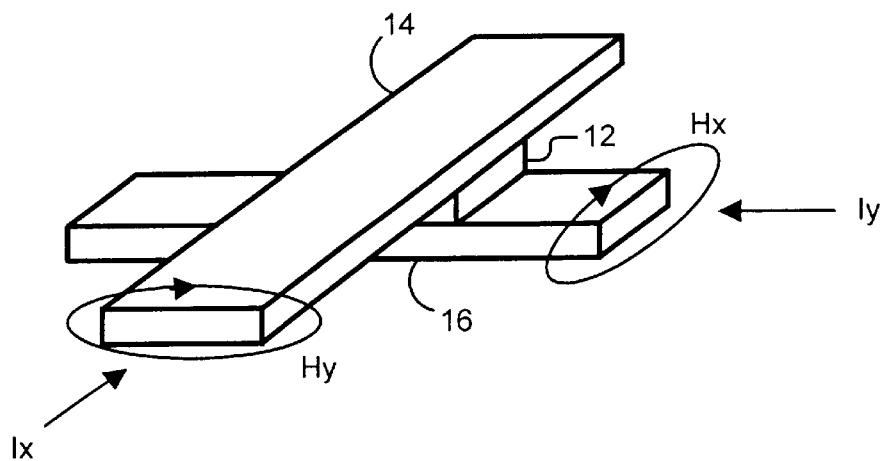
FIGURE 3 ately along an easy axis, and a second trace (e.g., a bit line) substantially orthogonal to the first trace. The memory cell is located at a crossing point of the first and second traces. Magnetization orientation of the memory cell is changed by applying a first current to the first trace and a second current to the second trace. Magnitude of the first current is substantially higher than (e.g., about twice) the magnitude of the second current. The first and second currents create a magnetic field that switches the magnetization orientation of the memory cell.

MRAM DEVICE INCLUDING WRITE CIRCUIT FOR SUPPLYING WORD AND BIT LINE CURRENT HAVING UNEQUAL MAGNITUDES

BACKGROUND OF THE INVENTION

The invention relates to random access memory for data storage. More specifically, the invention relates to a magnetic random access memory device including an array of memory cells and circuitry for writing data to the memory cells.

Magnetic Random Access Memory ("MRAM") is a type of non-volatile memory that is being considered for long term data storage. Accessing data from MRAM devices would be orders of magnitude faster than accessing data from conventional long term storage devices such as hard drives. Additionally, the MRAM devices would be more compact and would consume less power than hard drives and other conventional long term storage devices.

A typical MRAM device includes an array of memory cells. Word lines extend along rows of the memory cells, and bit lines extend along columns of the memory cells. Located at a cross point of a word line and a bit line, each memory cell stores a bit of information as an orientation of a magnetization. The magnetization orientation of each memory cell will assume one of two stable orientations at any given time. These two stable orientations, parallel and anti-parallel, represent logic values of "1" and "0." The magnetization orientation of a selected memory cell may be changed by supplying current to a word line and a bit line crossing the selected memory cell. The currents create magnetic fields that, when combined, can switch the magnetization orientation of the selected memory cell from parallel to anti-parallel or vice versa.

All of the other memory cells along the word and bit lines crossing the selected memory cell will hereinafter be referred to as "half-selected" memory cells. In order to switch the magnetization orientation of only the selected memory cell, all of the half-selected memory cells should be unaffected by the currents flowing through the word and bit lines crossing the selected memory cell.

A need exists to reduce the chances of half-selected memory cells being inadvertently switched; otherwise, the memory array will be gradually erased as bits are written into the array. Reducing this inadvertent switching will make MRAM devices more reliable.

A need also exists to reduce power consumption of MRAM devices, especially MRAM devices for portable applications such as notebook computers and digital cameras. Batteries supply the current to the word and bit lines during write operations. Reducing power consumption would extend battery life.

SUMMARY OF THE INVENTION

According to one aspect of the present invention, an MRAM device includes a memory cell, a first trace (e.g., a word line) extending substantially along an easy axis, and a second trace (e.g., a bit line) substantially orthogonal to the first trace. The memory cell is located at a crossing point of the first and second traces. Magnetization orientation of the memory cell is changed by applying a first current to the first trace and a second current to the second trace. Magnitude of the first current is substantially higher than (e.g., about twice) the magnitude of the second current. The first and second currents create a magnetic field that switches the magnetization orientation of the memory cell.

Supplying higher current magnitudes to the first trace has been found to increase stability of the memory cells because half-selected memory cells are unaffected while the magnetization orientation of the selected cell is being switched. Consequently, reliability of storing data in the MRAM devices is increased.

Supplying higher current magnitudes to the first trace has also been found to reduce power consumption when multiple memory cells lying along the same first trace are written to simultaneously. This is especially true for highly parallel modes of operation (e.g., 64-bit wide operations, 128-bit wide operations). Consequently, battery life of portable devices would be extended.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 2a and 2b are illustrations of magnetization orientations and corresponding resistance values of a memory cell;

FIG. 3 is an illustration a memory cell and its crossing word and bit lines during a write operation;

DETAILED DESCRIPTION OF THE INVENTION

Figure 1:
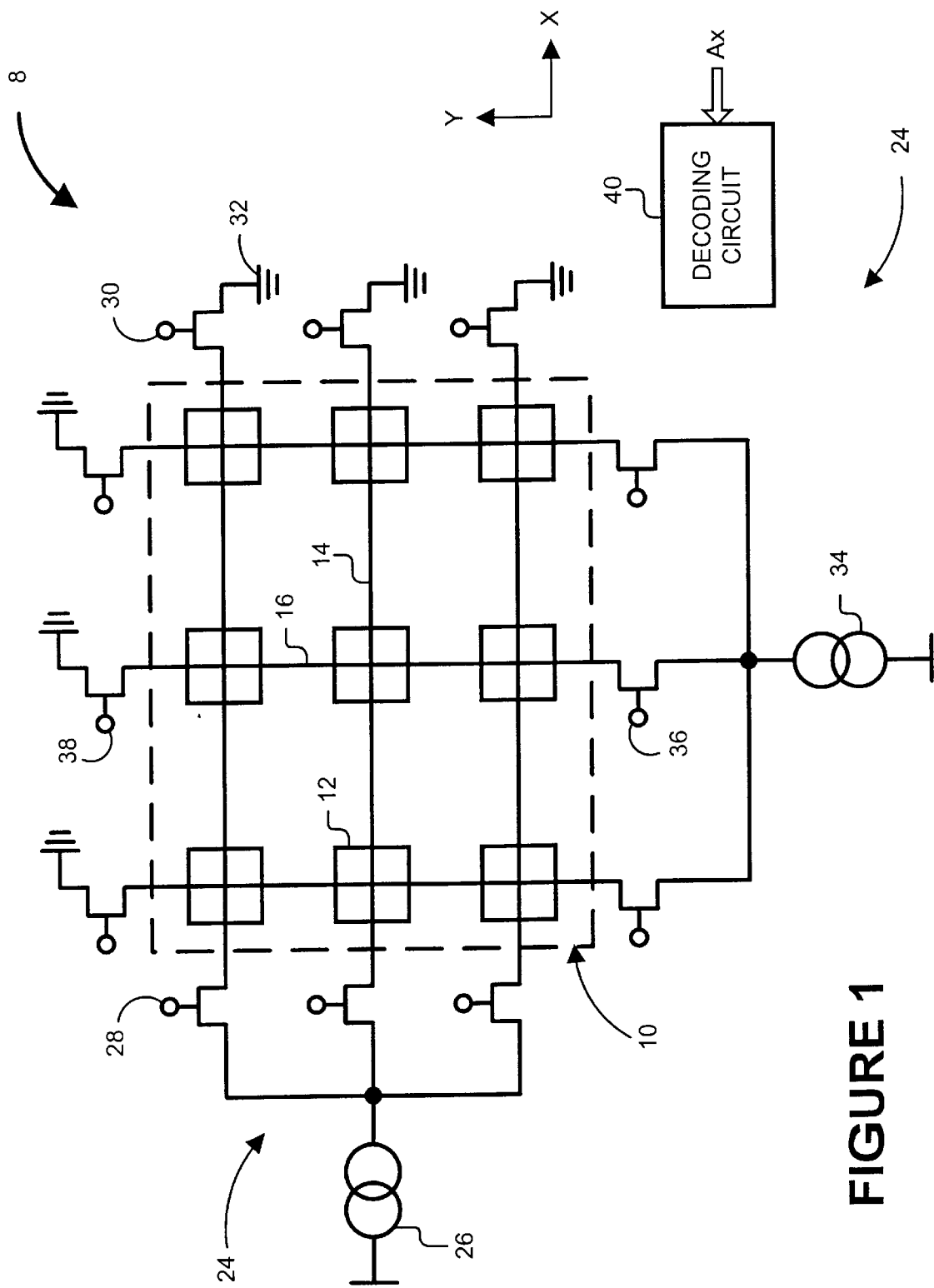
FIG. 1 is an illustration of an MRAM device including an array of memory cells and a write circuit in accordance with the present invention.

As shown in the drawings for purposes of illustration, the present invention is embodied by a Magnetic Random Access Memory device. The MRAM device includes a write circuit that supplies substantially higher magnitude currents to the word lines than to the bit lines. Supplying substantially higher current magnitudes to the word lines has been found to reduce the chances of inadvertently switching half-selected memory cells. Consequently, reliability of storing data in the MRAM devices is increased. Supplying substantially higher current magnitudes to the word lines has also been found to reduce power consumption for highly parallel modes of operation (e.g., 64-bit wide operations, 128-bit wide operations). Consequently, battery life of portable devices is extended.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of 1024× 1024 memory cells or larger may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the memory cell array 10. Each memory cell 12 is located at a crossing point of a corresponding word line 14 and bit line 16.

The memory cells 12 are not limited to any particular type of device. For example the memory cells 12 may be spin dependent tunneling ("SDT") devices. A typical SDT device includes a pinned layer having a magnetization that is oriented in the plane of the pinned layer but fixed so as not to rotate in the presence of an applied magnetic field in a range of interest. The SDT device also includes a "free" layer having a magnetization orientation that is not pinned. Rather, the magnetization can be oriented in either of two directions along an axis (the "easy" axis) lying in the plane of the free layer. If the magnetization of the free and pinned layers 18 and 20 are in the same direction, the orientation is said to be "parallel" (as indicated by the arrows in FIG. 2a). If the magnetization of the free and pinned 18 and 20 layers are in opposite directions, the orientation is said to be "anti-parallel" (as indicated by the arrows in FIG. 2b).

The free layer and the pinned layer are separated by an insulating tunnel barrier. The insulating tunnel barrier allows quantum mechanical tunneling to occur between the free and pinned layers. This tunneling phenomenon is electron spin dependent, making the resistance of the SDT device a function of the relative orientations of the magnetization of the free and pinned layers.

For instance, resistance of a memory cell 12 might be a first value R if the orientation of magnetization of the free and pinned layers 18 and 20 is parallel (see FIG. 2a). Resistance of the memory cell 12 is increased to a second value R+ΔR if the magnetization of orientation is changed from parallel to anti-parallel (see FIG. 2b).

Data is stored in a memory cell 12 by orienting the magnetization along the easy axis of the free layer. A logic value of "0" may be stored in the memory cell by orienting the magnetization of the free layer such that the magnetization orientation is parallel, and a logic value of "1" may be stored in the memory cell by orienting the magnetization of the free layer such that the magnetization orientation is anti-parallel.

The logic value stored in a selected memory cell 12 may be read by sensing the resistance of the selected memory cell 12. For example, a voltage may be applied to the word and bit lines 14 and 16 crossing the selected memory cell 12, thereby causing a current to be generated. The current can be measured to determine whether the memory cell has a resistance of value R corresponding to the first state or the value R+ΔR corresponding to the second state.

Each memory cell 12 retains the orientation of magnetization, even in the absence of external power. Therefore, the memory cells 12 are non-volatile.

Additional reference is made to FIG. 3, which illustrates a selected memory cell 12 during a write operation. The magnetization in the free layer 18 of the selected memory cell 12 is oriented by applying currents Ix and Iy to both the word line 14 and bit line 16 of that memory cell 12. Applying the current Ix to the word line 14 causes a magnetic field Hy to form around the word line 14. Applying the current Iy to the bit line 16 causes a magnetic field Hx to form around the bit line 16. When a sufficiently large current is passed through both of these lines 14 and 16, the combined magnetic field in the vicinity of the free layer 18 causes the magnetization of the free layer 18 to rotate from the parallel orientation to the anti-parallel orientation, or vice-versa. The current magnitudes are selected so that the combined magnetic field exceeds the switching field of the free layer 18 but does not exceed the switching field of the pinned layer 20. Thus, applying both magnetic fields Hx and Hy causes the magnetization orientation of the free layer 18 to switch.

According to a standard model for switching of a magnetic material, the smallest total field (and, therefore, the lowest power) required to switch the magnetization occurs when two equal and orthogonal fields are applied to the magnetic material. Therefore, in conventional (i.e., prior art) MRAM devices, equal magnitude currents are supplied to both the word line 14 and the bit line 16.

Figure 4:
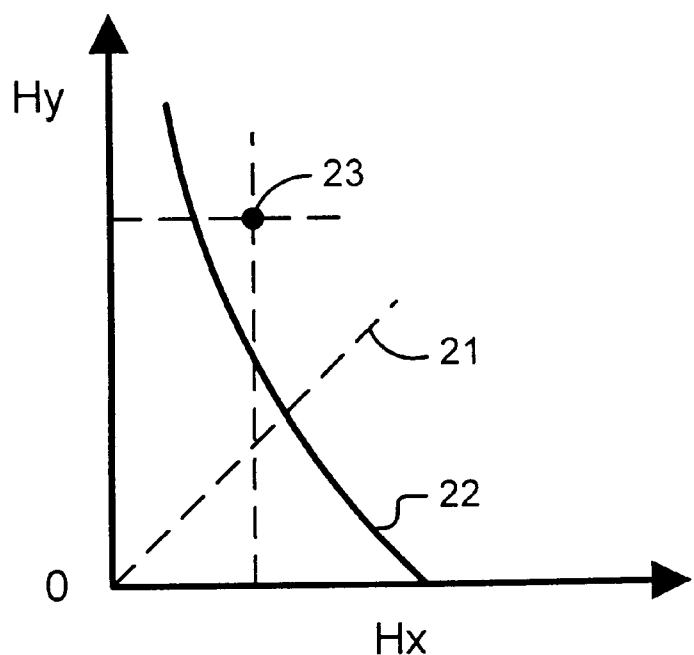
FIG. 4 is an illustration of a switching curve for a memory cell.

However, the applicants have found that the switching curve is not symmetric for very small memory cells used in high density applications. Rather, the switching curve is non-symmetric. An example of a non-symmetric switching curve 22 is shown in FIG. 4.

In view of the non-symmetric switching curve 22, magnitude of the current supplied to the word lines 14 is made substantially higher than the magnitude of the current supplied to the bit lines 16. For example, the word line current magnitude could be between one-and-one-half and five times the bit line current magnitude. A more narrow range might be between one-and-one-half and two times the bit line current magnitude. The word line current magnitude could even be greater than five times the bit line current magnitude. The actual current magnitudes for a particular set of MRAM dimensions and materials will be specified by optimizing the word line and bit line currents separately. As long as the combined magnetic field Hx and Hy lies on or to the right of the switching curve 22, the combined magnetic field Hx and Hy will be able to switch the memory cell 12 when the currents Ix and Iy are applied to the word and bit lines 14 and 16. The dashed line 21 represents Hx=Hy, and the circle 23 in FIG. 4 illustrates one possible operating point.

Returning to FIG. 1, the MRAM device 8 further includes a write circuit 24 for supplying the currents Ix and Iy to the word and bit lines 14 and 16 during a write operation. The write circuit 24 includes a word line current source 26 and first and second row select transistors 28 and 30 for each word line 14. Each first row select transistor 28 is coupled between a corresponding word line 14 and the word line current source 26. Each second row select transistor 30 is coupled between a corresponding word line 14 and a reference potential 32 (e.g., ground).

The write circuit 24 further includes a bit line current source 34 and first and second column select transistors 36 and 38 for each bit line. Each first column select transistor 36 is coupled between a corresponding bit line 16 and the bit line current source 34. Each second column select transistor 38 is coupled between a corresponding bit line 16 and the reference potential 32.

Data may be written in m-bit words. If the data is written in m-bit words, a decoding circuit 40 decodes an address Ax and turns on the appropriate row and column select transistors 28, 30, 36 and 38 (traces extending from the decoding circuit 40 to gates of the select transistors 28, 30, 36 and 38 are not shown). Thus, a single word line 14 is energized with the higher magnitude current and a number m of bit lines 16 are energized with the lower magnitude current, whereby a number m (e.g., 64, 128) of memory cells 12 are selected simultaneously. The half-selected memory cells are unaffected.

Additionally, applying the higher magnitude current to the word line 14 and the lower magnitude current to as many as m bit lines 16 results in a much lower power consumption than applying equal currents to the word line 14 and all m bit lines 16. For instance, if an m-bit word is written to m consecutive memory cells, and the bit line current Iy equals the word line current Ix, the power consumption P is $P=(m+1)I^2R$, where nominal current I=Ix=Iy, and R is the line resistance. On the other hand, if the word line 14 is supplied with current Ix having a magnitude that is twice the magnitude of the nominal current I (i.e., Ix=2I) and the bit lines 16 are supplied with current Iy having a magnitude that is one-half the magnitude of the nominal current I (i.e., Iy=1/2), the power consumption P' will be $P'=(2I)^2R+m(I/2)^2R=(4+m/4)I^2R$, which for large values of m results in a quarter of the power being consumed. The power savings would become especially significant for highly parallel operations such as 64-bit wide and 128-bit wide operations.

The MRAM device 8 also includes a read circuit for sensing the resistance of each selected memory cell 12. The read circuit is not shown in order to simplify the explanation of the present invention. Additionally, the description of the write circuit 24 has been simplified to simplify the explanation of the present invention. Although only a single word line current source 26 for all of the word lines 14 is shown, the write circuit 24 may include more than one word line current source 26. Although only a single bit line current source 34 for all of the bit lines 16 is shown, the write circuit 24 may include more than one bit line current source 34. There are may different ways of connecting switches and current sources to the rows and columns.

The word line current source 26 may be designed to provide currents of substantially higher magnitude than the bit line current source 34. Similarly, the word lines 14 may be designed to carry current of substantially higher magnitude than the bit lines 16.

Applying currents of substantially higher magnitudes to the word lines reduces the chances of inadvertently switching half-selected memory cells. In the case of a word line 14 directed along the easy axis of the memory cell 12, the magnetic field Hy produced by the word line 14 does not play as strong a role as the magnetic field Hx produced by the bit line 16 during the switching of a memory cell 12. The non-symmetry is believed to arise from the large distribution of magnetization angles that result from the effect of the element shape (called shape demagnetizing fields). Since the magnetization already has regions rotated substantially in the y-direction, the influence of the magnetic field Hy produced by the word line 14 is diminished. By increasing the word line current and decreasing the bit line current, one is still able to provide adequate switching of the selected memory cell. However, the lower bit line current reduces the chances of inadvertently switching the half-selected memory cells. Therefore, increasing the magnitude of the word line current and decreasing the magnitude of the bit line current (provided that the currents lie on or to the right of the switching curve) will reduce the chance of inadvertently switching a half-selected memory cell that lies along the same bit line 16 as the selected memory cell 12.

When the magnitudes of the bit line and word line currents are equal, in contrast, it becomes difficult to select a bit line magnetic field Hx that alone does not switch the half-selected memory cells, even though those half-selected memory cells do not see an orthogonal magnetic field (i.e., the magnetic field Hy produced by a corresponding word line). Thus, it is difficult to select a bit line magnetic field Hx that does not cause the half-selected memory cells to be switched.

Figure 5:
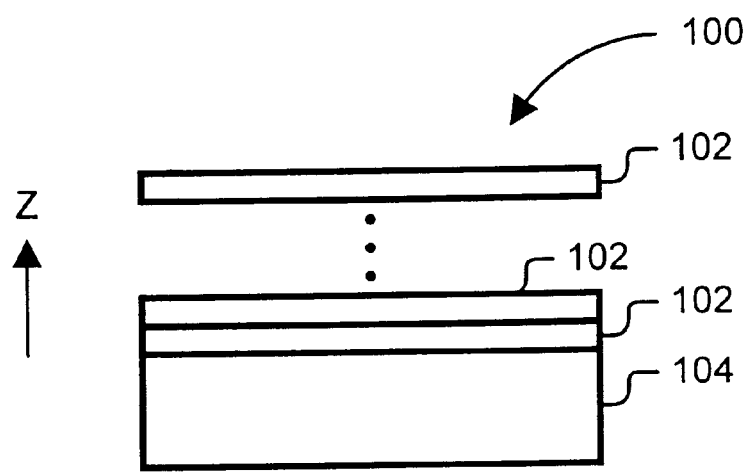
FIG. 5 is an illustration of an MRAM chip in accordance with the present invention.

Reference is now made to FIG. 5, which illustrates a multi-level MRAM chip 100. The MRAM chip 100 includes a number N of memory cell levels 102 that are stacked in a z-direction on a substrate 104. The number N is positive integer where N≧1. The memory cell levels 102 may be separated by insulating material (not shown) such as silicon dioxide. Read and write circuits may be fabricated on the substrate 104. The read and write circuits may include additional multiplexers for selecting the levels that are read from and written to.

Thus disclosed is an MRAM device including a write circuit that supplies current of substantially higher magnitude to the word lines than to the bit lines. Supplying current of higher magnitude to the word lines can reduce the chances of inadvertently switching half-selected memory cells, especially in the case of very small memory cells having non-symmetric switching curves. Consequently, reliability of storing data in the MRAM devices is increased.

Supplying substantially higher magnitudes current to the word lines has also been found to reduce power consumption when multiple memory cells lying along the same word line are written to simultaneously. This is especially true for MRAM devices that are architected to provide many parallel bits of output in order to provide high data rates. Consequently, battery life of portable devices would be extended.

Reducing power consumption also reduces heat generated by the MRAM devices.

Figure 6:
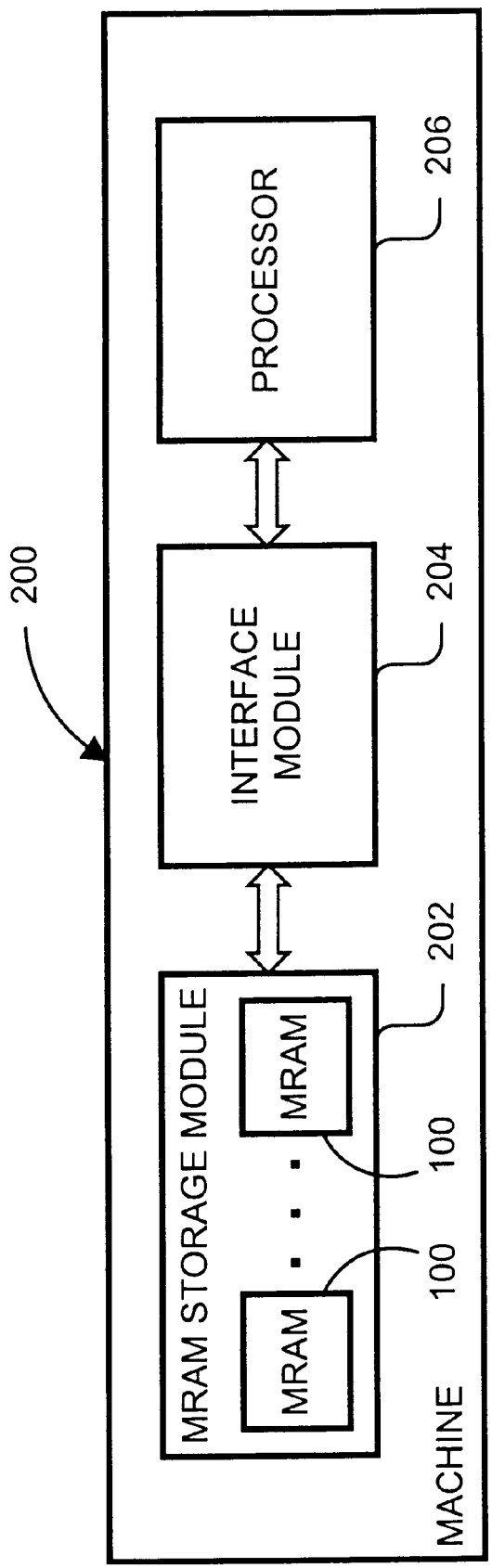
FIG. 6 is an illustration of a machine including one or more MRAM chips.

The MRAM device according to the present invention could be used in a wide variety of applications. FIG. 6 shows an exemplary general application for one or more MRAM chips 100. The general application is embodied by a machine 200 including an MRAM storage module 202, an interface module 204 and a processor 206. The MRAM storage module 202 includes one or more MRAM chips 100 for long term storage. The interface module 204 provides an interface between the processor 206 and the MRAM storage module 202. The machine 200 could also include fast volatile memory (e.g., SRAM) for short term storage.

For a machine 200 such as a notebook computer or personal computer, the MRAM storage module 202 might include a number of MRAM chips 100 and the interface module 204 might include an EIDE or SCSI interface. For a machine 200 such as a server, the MRAM storage module 204 might include a greater number of MRAM chips 100, and the interface module 204 might include a fiber channel or SCSI interface. Such MRAM storage modules 202 could replace or supplement conventional long terms storage devices such as hard drives.

For a machine 200 such as a digital camera, the MRAM storage module 202 might include a smaller number of MRAM chips 100 and the interface module 204 might include a camera interface. Such an MRAM storage module 202 would allow long term storage of digital images on-board the digital camera.

The MRAM device according to the present invention offers many advantages over conventional long-term data storage devices such as hard drives. Accessing data from the MRAM devices is orders of magnitude faster than accessing data from conventional long-term storage devices such as hard drives. Additionally, MRAM devices are more compact than hard drives.

The invention is not limited to the specific embodiments described and illustrated above. For instance, the invention is not limited to the use of spin dependent tunneling devices. Other types of devices that could be used include, but are not limited to, giant magnetoresistance ("GMR") devices.

The invention has been described in connection with the rows being oriented along the easy axis. However, the rows and columns could be transposed, in which case the columns would be oriented along the easy axis and the higher magnitude currents would be supplied to the traces extending along the columns instead of the rows.

Accordingly, the invention is not limited to the specific embodiments described and illustrated above. Instead, the invention is construed according to the claims that follow.

What is claimed is:

1. A magnetic random access memory chip comprising:
   a substrate including a write circuit, the write circuit including at least one first current source and at least one second current source, each first current source providing a substantially higher magnitude current than each second current source;
   at least one memory cell level stacked on the substrate, each memory cell level including an array of memory cells arranged in first and second orthogonal directions, easy axes of the memory cells being directed long the first direction;
   each memory cell level further including a plurality of first traces extending substantially in the first direction, each first trace lying along a corresponding plurality of memory cells and, when selected, being connected to a corresponding first current source during a write operation; and
   each memory cell level further including a plurality of second traces extending substantially in the second direction, each second trace lying along a corresponding plurality of memory cells and, when selected, being connected to a corresponding second current source during a write operation.

2. The chip of claim 1, wherein magnitude of the current provided by the first current source is between 1.5 and 5 times magnitude of the current provided by the second current source.

3. The chip of claim 1, wherein magnitude of the current provided by the first current source is about twice magnitude of the current provided by the second current source.

4. The chip of claim 1, wherein the memory cells include spin dependent tunneling devices.

5. The chip of claim 1, further comprising means for simultaneously selecting a number k of memory cells during a write operation, where integer k>1, whereby current is simultaneously supplied to as many as k traces crossing the first trace.

6. The chip of claim 1, wherein the write circuit further includes:
   first and second select devices for each first trace, the first select devices being connected to a corresponding first current source, the second select devices being connected to a reference potential; and
   third and fourth select devices for each second trace, the third select devices being connected to a corresponding second current source, the fourth select devices being connected to the reference potential.

7. An MRAM device comprising:
   a memory cell;
   a word line and a bit line crossing the memory cell;
   a first current source for supplying a first current to the word line during a write operation;
   a second current source for supplying a second current to the bit line during the write operation; and
   wherein the first current has a substantially higher magnitude than the second current.

8. The device of claim 7, wherein the magnitude of the first current is between 1.5 and 5 times magnitude of the second current.

9. The device of claim 7, wherein magnitude of the first current is about twice magnitude of the second current.

10. The device of claim 7, wherein the memory cell includes a spin dependent tunneling device.

11. A method of writing to a memory cell of an MRAM device, the MRAM device including a first trace extending substantially along an easy axis of the memory cell and a second trace substantially orthogonal to the first trace, the memory cell being located at a crossing point of the first and second traces, the method comprising the steps of:
    applying a first current to the first trace; and
    applying a second current to the second trace;
    wherein magnitude of the first current is substantially greater than magnitude of the second current, the first and second currents creating a magnetic field that switches a magnetization orientation of the memory cell.

12. The method of claim 11, wherein magnitude of the first current is between 1.5 and 5 times magnitude of the second current.

13. The method of claim 11, wherein magnitude of the first current is about twice magnitude of the second current.

14. The method of claim 11, wherein the second current is supplied to additional traces crossing the first trace, whereby a plurality of additional memory cells are selected simultaneously during a write operation.

* * * * *